(12) United States Patent
Yamamoto et al.

(10) Patent No.: US 9,722,127 B2
(45) Date of Patent: Aug. 1, 2017

(54) PHOTOCOUPLER HAVING LIGHT RECEIVING ELEMENT, LIGHT EMITTING ELEMENT AND MOSFET ON A DIE PAD UNIT OF A MOUNTING MEMBER THAT INCLUDES TERMINALS WITH MULTIPLIED CONDUCTIVE REGIONS

(71) Applicant: Kabushiki Kaisha Toshiba, Minato-ku, Tokyo (JP)

(72) Inventors: Mami Yamamoto, Oita-Ken (JP); Yoshio Noguchi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/165,218

(22) Filed: May 26, 2016

(65) Prior Publication Data

US 2016/0268241 A1    Sep. 15, 2016

Related U.S. Application Data

(63) Continuation of application No. 14/860,486, filed on Sep. 21, 2015, now Pat. No. 9,379,273, which is a (Continued)

(30) Foreign Application Priority Data

Sep. 12, 2013    (JP) ................................. 2013-189400

(51) Int. Cl.
*H01L 31/173*    (2006.01)
*H01L 31/02*    (2006.01)
(Continued)

(52) U.S. Cl.
CPC ...... *H01L 31/173* (2013.01); *H01L 23/49575* (2013.01); *H01L 25/167* (2013.01); (Continued)

(58) Field of Classification Search
CPC . H01L 31/167; H01L 23/49575; H01L 23/34; H01L 23/142; H01L 23/3185; G02B 6/4259

See application file for complete search history.

(56) References Cited

U.S. PATENT DOCUMENTS 5,629,534 A    5/1997  Inuzuka et al.
5,832,600 A    11/1998  Hashimoto
(Continued)

FOREIGN PATENT DOCUMENTS

CN    102760825 A    10/2012
JP    09036413 A    2/1997
(Continued)

OTHER PUBLICATIONS

Japanese Office Action issued on Jan. 12, 2016 in counterpart Japanese patent application No. 2013-1849400, and English translation thereof.

(Continued)

*Primary Examiner* — Michael Jung
(74) *Attorney, Agent, or Firm* — White & Case LLP

(57) ABSTRACT

A mounting member includes: an insulating substrate, a first die pad unit, first and second terminals. The insulating substrate has a rectangular first surface, a second surface, a first side surface, a second side surface, a third side surface, and a fourth side surface. A through hole is provided from the first surface to the second surface. The first die pad unit is provided on the first surface. The first terminal has a conductive region covering the first side surface, the first surface, and the second surface. The second terminal has a conductive region covering the second side surface and the second surface, connected to the first die pad unit by conductive material provided in the through hole or on a side (Continued)

wall of the through hole. The first die pad unit, the first terminal, and the second terminal are apart from one another.

18 Claims, 8 Drawing Sheets

Related U.S. Application Data continuation of application No. 14/162,145, filed on Jan. 23, 2014, now Pat. No. 9,171,969.

(51) Int. Cl.
  H01L 23/495    (2006.01)
  H01L 31/167    (2006.01)
  H01L 25/16     (2006.01)
  H01L 31/0203   (2014.01)

(52) U.S. Cl.
  CPC .... *H01L 31/0203* (2013.01); *H01L 31/02005* (2013.01); *H01L 31/167* (2013.01); *H01L 2224/0603* (2013.01); *H01L 2224/48137* (2013.01); *H01L 2224/49171* (2013.01); *H01L 2224/73265* (2013.01); *H01L 2924/181* (2013.01)

(56) References Cited

U.S. PATENT DOCUMENTS

| | | | |
|---|---|---|---|
| 6,548,880 B1* | 4/2003 | Hirasawa | H01L 31/167 257/414 |
| 7,235,804 B2 | 6/2007 | Aki | |
| 2002/0053742 A1 | 5/2002 | Hata et al. | |
| 2005/0029633 A1* | 2/2005 | Yumura | H01L 25/167 257/666 |
| 2005/0035356 A1 | 2/2005 | Kek et al. | |
| 2005/0194667 A1 | 9/2005 | Huang et al. | |
| 2005/0207697 A1 | 9/2005 | Kek et al. | |
| 2009/0146298 A1 | 6/2009 | Masumoto | |
| 2011/0186875 A1 | 8/2011 | Egoshi et al. | |
| 2011/0235974 A1 | 9/2011 | Tay et al. | |
| 2012/0273826 A1 | 11/2012 | Yamamoto et al. | |
| 2013/0200397 A1* | 8/2013 | Biwa | H01L 31/173 257/82 |
| 2014/0284629 A1 | 9/2014 | Takai et al. | |
| 2015/0014829 A1 | 1/2015 | Abbott | |
| 2015/0069423 A1 | 3/2015 | Yamamoto et al. | |

FOREIGN PATENT DOCUMENTS

| | | |
|---|---|---|
| JP | 2001156325 A | 6/2001 |
| JP | 2005-064513 A | 3/2005 |
| JP | 2010-034103 A | 2/2010 |
| JP | 2010034103 A | 2/2010 |
| JP | 2011009326 | 1/2011 |
| JP | 2011233565 A | 11/2011 |
| JP | 2015-056531 A | 3/2015 |

OTHER PUBLICATIONS

Taiwanese Office Action issued on Jan. 21, 2016 in counterpart Taiwanese patent application No. 103120026 and English translation thereof.

Chinese Office Action issued on Oct. 9, 2016 in counterpart Chinese patent application No. 2013 10722 113.8 and English translation thereof.

\* cited by examiner

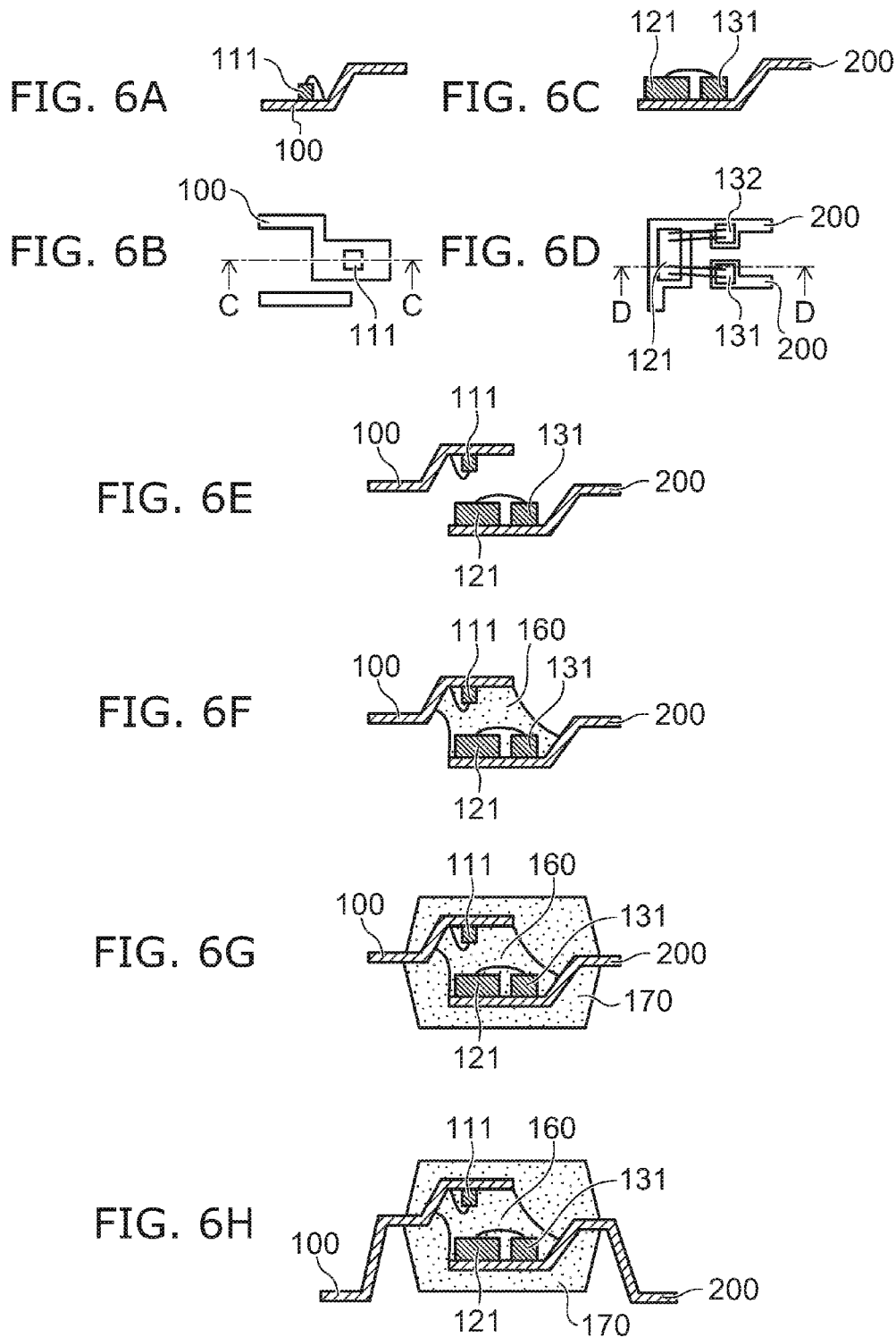

PHOTOCOUPLER HAVING LIGHT RECEIVING ELEMENT, LIGHT EMITTING ELEMENT AND MOSFET ON A DIE PAD UNIT OF A MOUNTING MEMBER THAT INCLUDES TERMINALS WITH MULTIPLIED CONDUCTIVE REGIONS

CROSS-REFERENCE TO RELATED APPLICATIONS

"This is a Continuation of application Ser. No. 14/860,486, filed on Sep. 21, 2015, issued as Pat. No. 9,379,273, which claims benefit of application Ser. No. 14/162,145, filed on Jan. 23, 2014, issued as Pat. No. 9,171,969, which is based upon and claims the benefit of priority from Japanese Patent Application No. 2013-189400, filed on Sep. 12, 2013; the entire contents of each are incorporated herein by reference."

FIELD

Embodiments described herein relate generally a mounting member and a photocoupler.

BACKGROUND

A photocoupler (including a photorelay) can convert an input electric signal into an optical signal using a light emitting element, receive the optical signal using a light receiving element, and then output an electric signal. Hence, the photocoupler can transmit an electric signal in a state where the input side and the output side are insulated from each other.

In industrial equipment, office equipment, and household electrical equipment, different power supply systems such as a DC voltage system, an AC power supply system, a telephone line system, and a control system are arranged in one equipment. However, if different power supply systems are directly connected, an operational malfunction may occur.

If the photocoupler is used, insulation is provided between different power sources and therefore the operational malfunction can be suppressed.

For example, a large number of photocouplers, including those for AC loads, are used in inverter air conditioners etc. In the case of signal switching in LSI testers, a very large number of photocouplers are used. In such a case, downsizing is strongly required from the necessity to reduce the area of mounting onto a substrate. Even with a small size, it is required to maintain high moisture resistance and reliability.

BRIEF DESCRIPTION OF THE DRAWINGS

FIGS. 6A to 6H are schematic views showing the manufacturing process of an opposed-type photocoupler according to a comparative example;

DETAILED DESCRIPTION

In general, according to one embodiment, a mounting member includes: an insulating substrate, a first die pad unit, a first terminal and a second terminal. The insulating substrate has a rectangular first surface, a second surface on an opposite side of the first surface, a first side surface, a second side surface on an opposite side of the first side surface, a third side surface, and a fourth side surface on an opposite side of the third side surface. A through hole is provided from the first surface to the second surface. The first die pad unit is provided on the first surface. The first terminal has a conductive region covering the first side surface, the first surface, and the second surface. The second terminal has a conductive region covering the second side surface and the second surface, connected to the first die pad unit by conductive material provided in the through hole or on a side wall of the through hole, and insulated from the first terminal. The first die pad unit, the first terminal, and the second terminal are apart from one another on the first surface of the insulating substrate as viewed from above.

Hereinbelow, embodiments of the invention are described with reference to the drawings.

Figure 1A:
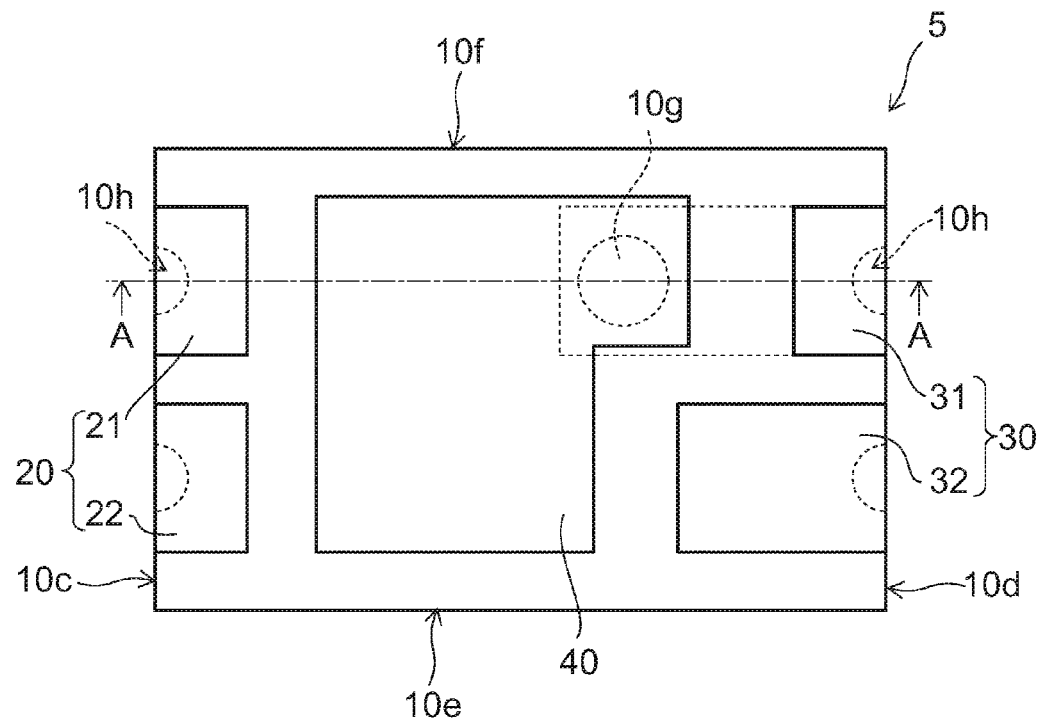
FIG. 1A is a schematic plan view of a mounting member according to a first embodiment.
Figure 1B:
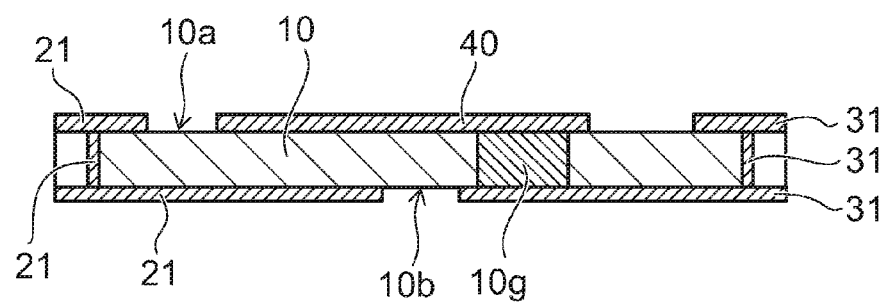
FIG. 1B is a schematic cross-sectional view taken along line A-A.

FIG. 1A is a schematic plan view of a mounting member according to a first embodiment, and FIG. 1B is a schematic cross-sectional view taken along line A-A.

The mounting member includes an insulating substrate 10, a first die pad unit 40, a first terminal 20, and a second terminal 30.

The insulating substrate 10 has a rectangular first surface 10a, a second surface 10b on an opposite side of the first surface 10a, a first side surface 10c, a second side surface 10d on an opposite side of the first side surface 10c, a third side surface 10e, and a fourth side surface 10f on an opposite side of the third side surface 10e; and a through hole 10g extending from the first surface 10a to the second surface 10b is provided. The insulating substrate 10 may be made of glass fibers or the like, and may have a thickness of 0.1 to 0.5 mm or the like.

A notch 10h may be provided on the first side surface 10c and the second side surface 10d of the insulating substrate 10. A conductive material may be provided on the inner wall of the notch 10h.

The first terminal 20 has two conductive regions 21 and 22, for example. In each of the conductive regions 21 and 22, a conductive region provided on the first surface 10a and a conductive region provided on the second surface 10b are connected via a conductive region of the first side surface 10c. When the conductive region of the first side surface 10c and an interconnection unit such as a circuit board are bonded by a solder fillet or the like, the checking of the bonding state of the solder material is easy. As shown in FIG. 1, it is also possible to provide the notch 10h on the first side surface 10c and provide a conductive region on the surface of the notch 10h.

Similarly, the second terminal 30 has two conductive regions 31 and 32, for example. In each of the conductive regions 31 and 32, a conductive region provided on the first surface 10a and a conductive region provided on the second surface 10b are connected via a conductive region provided on the notch 10h.

The first pad unit 40 is provided on the first surface 10a. The second terminal 30 is connected to the first die pad unit 40 by conductive material. The conductive material includes a paste layer or a plated layer provided in the through hole 10g, or a conductive metallized region provided on a side wall of the through hole 10g. The second terminal 30 is insulated from the first terminal 20.

The conductive regions of the first die pad unit 40, the first terminal 20, and the second terminal 30 may be made of Cu foil provided on the first surface 10a of the insulating substrate 10, a plated layer of Ni, Au, or the like stacked on the Cu foil, and the like. As viewed from above, the first die pad unit 40, the first terminal 20, and the second terminal 30 are apart from one another on the first surface 10a of the insulating substrate 10.

Figure 2A:
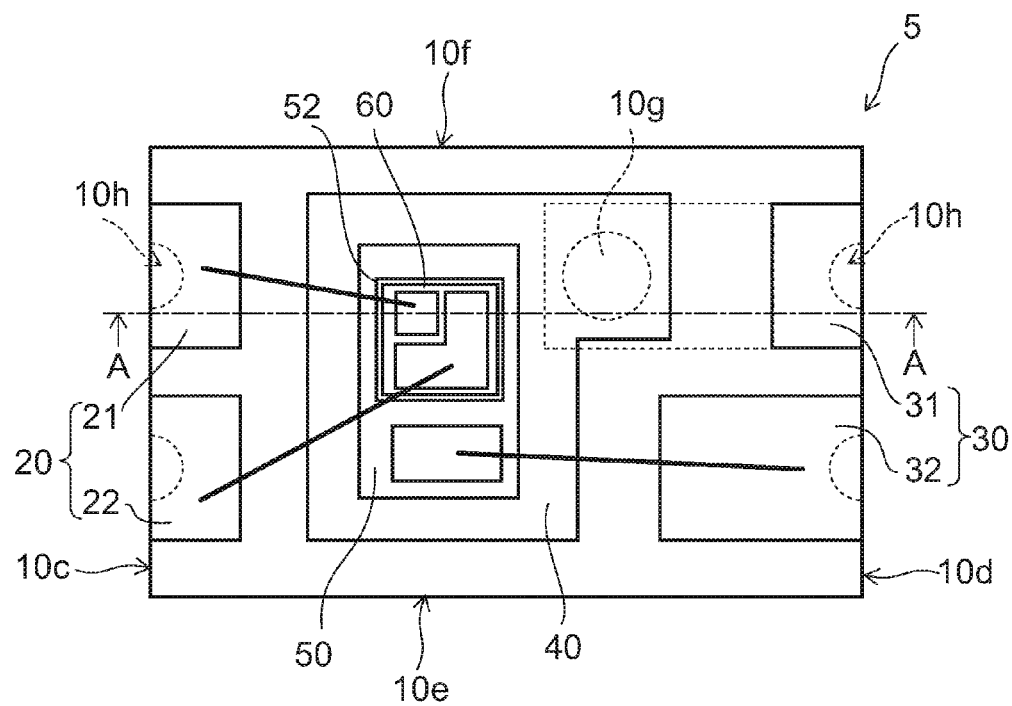
FIG. 2A is a schematic plan view of a photocoupler using the mounting member according to the first embodiment.
Figure 2B:
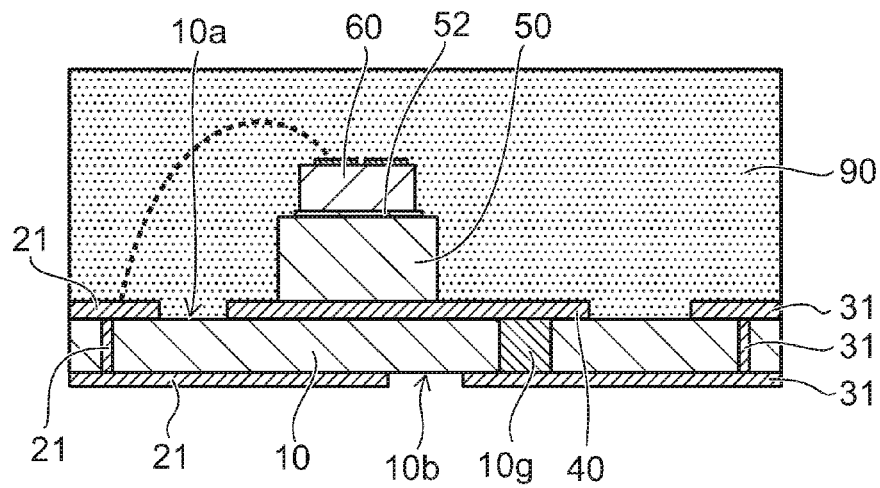
FIG. 2B is a schematic cross-sectional view taken along line A-A.

FIG. 2A is a schematic plan view of a photocoupler using the mounting member according to the first embodiment, and FIG. 2B is a schematic cross-sectional view taken along line A-A.

The photocoupler includes the mounting member 5 of FIG. 1, a light receiving element 50, a light emitting element 60, and a sealing resin layer 90. The light receiving element 50 is bonded to the first die pad unit 40, and has a light receiving surface on its upper surface. The light emitting element 60 emits light from its back surface toward the upper surface of the light receiving element 50. A bonding layer 52 has light transmissivity and insulating properties, and bonds the light emitting element 60 to the upper surface of the light receiving element 50. The bonding layer 52 may be made of an insulating paste or the like containing a polyimide resin, an epoxy resin, a silicone resin, or the like, and the sealing resin layer 90 may be made of an epoxy resin, a silicone resin, or the like.

The anode electrode and the cathode electrode of the light emitting element 60 are connected to the first terminals 21 and 22, respectively, by bonding wires or the like. One electrode provided on the first surface of the light receiving element 50 is connected to the second terminal 32 by a bonding wire or the like. The other electrode of the light receiving element 50 (for example, provided on the back surface) is bonded to the first die pad unit 40, and is connected to the second terminal 31 via the through hole 10g.

The sealing resin layer 90 covers the light receiving element 50, the light emitting element 60, and the first surface 10a of the insulating substrate 10, and protects the light emitting element 60, the light receiving element 50, the bonding wires, etc. As viewed from above, the first die pad unit 40, the first terminal 20, and the second terminal 30 are apart from one another on the first surface 10a of the insulating substrate 10. Therefore, the sealing resin layer 90 adheres firmly to the first surface 10a of the insulating substrate 10, and can maintain high moisture resistance and reliability.

Figure 3A:
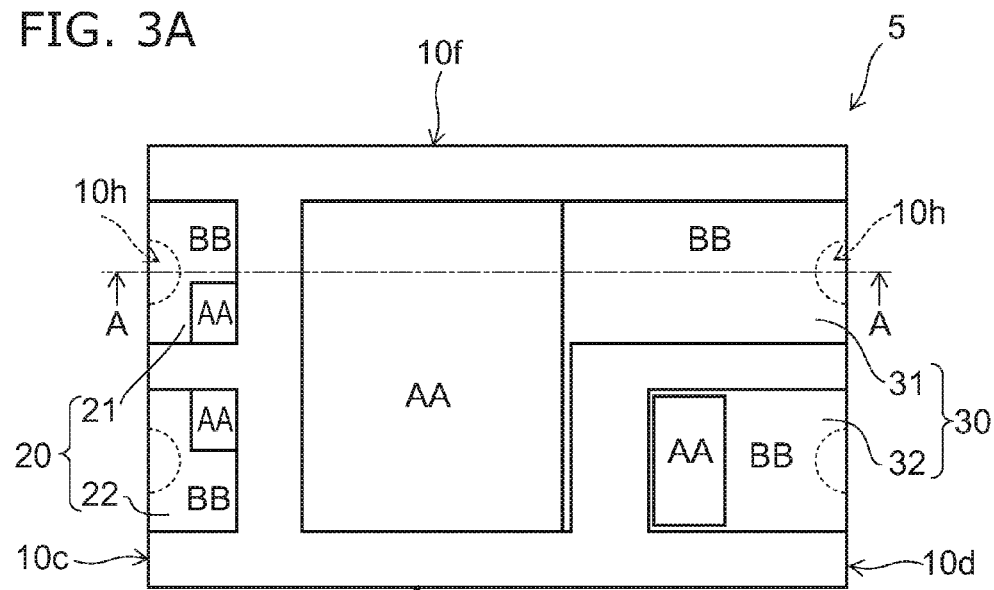
FIG. 3A is a schematic plan view of a mounting member according to a second embodiment.
Figure 3B:
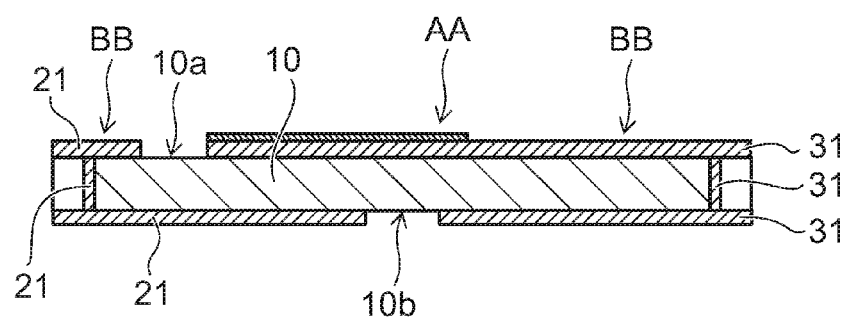
FIG. 3B is a schematic cross-sectional view taken along line A-A.
Figure 3C:
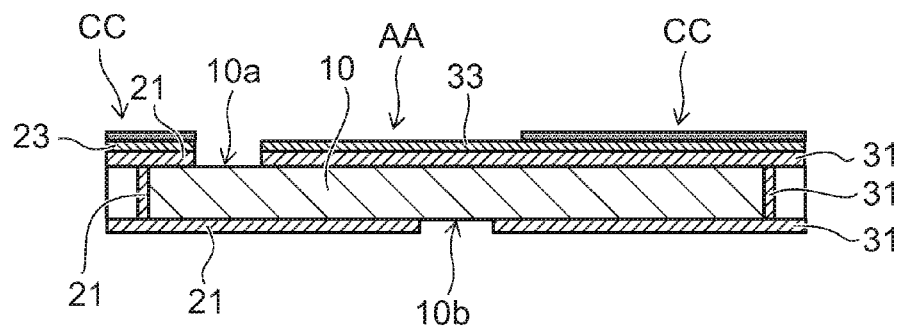
FIG. 3C is a schematic cross-sectional view of a modification example taken along line A-A.

FIG. 3A is a schematic plan view of a mounting member according to a second embodiment, FIG. 3B is a schematic cross-sectional view taken along line A-A, and FIG. 3C is a schematic cross-sectional view of a modification example taken along line A-A.

The mounting member 5 includes the insulating substrate 10, the first terminal 20, and the second terminal 30.

The insulating substrate 10 has the rectangular first surface 10a, the second surface 10b on the opposite side of the first surface 10a, the first side surface 10c, the second side surface 10d on an opposite side of the first side surface 10c, the third side surface 10e, and the fourth side surface 10f on an opposite side of the third side surface 10e.

The notch 10h may be provided on the first side surface 10c and the second side surface 10d of the insulating substrate 10. A conductive region may be provided on the side surface of the notch 10h.

The first terminal 20 has the two conductive regions 21 and 22. In each of the conductive regions 21 and 22, a conductive region provided on the first surface 10a and a conductive region provided on the second surface 10b are connected via a conductive region provided on the notch 10h.

The second terminal 30 has the two conductive regions 31 and 32. In each of the conductive regions 31 and 32, a conductive region provided on the first surface 10a and a conductive region provided on the second surface 10b are connected via a conductive region provided on the notch 10h. The second terminal 30 and the first terminal 20 are insulated.

In FIG. 3B, the first terminal 20 and the second terminal 30 have a first conductive region AA including a surface protection layer containing Au or Ag and a second conductive region BB having a surface made of Cu or the like differently from the surface protection layer of the first conductive region AA. As viewed from above, the first terminal 20 and the second terminal 30 are apart from each other on the first surface 10a of the insulating substrate 10.

The Cu forms a main current path. The first conductive region AA contains Cu, and Au or Ag provided thereon, and is provided in order to surely make the bonding of a semiconductor element and wire bonding.

However, in the first conductive region AA, the Au or Ag has insufficient adhesion to the sealing resin layer 90, and has insufficient moisture resistance and reliability. Thus, after the Cu is formed, the region where the second conductive region BB will be formed is covered with a mask or the like not to form Au or Ag on the region. In this way, the adhesion between the sealing resin layer 90 and the second conductive region BB with a surface layer made of Cu of the second terminal 31 can be enhanced.

Alternatively, as shown in FIG. 3C, the first and second terminals 20 and 30 are provided with surface protection layers 23 and 33, respectively, containing Au, Ag, or the like on Cu, and a mask or the like is provided on the first conductive regions AA on the first and second terminals 20 and 30 to form the second conductive regions CC. The second conductive region CC is configured to contain, in its surface, Cu, Ni, Pd, or the like, which is good in the adhesion to the sealing resin layer 90, or configured to include, in its surface, an oxide film of approximately at least several nanometers or the like. The thickness of the oxide of the surface of the second conductive region BB is preferably set thick as compared to the surface of the first conductive region AA.

Figure 4A:
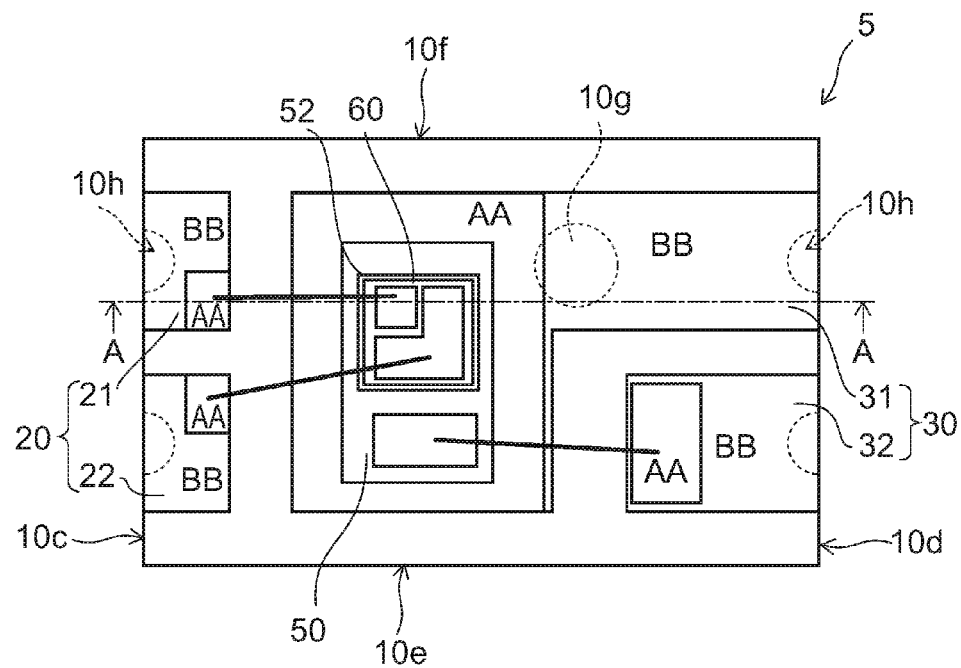
FIG. 4A is a schematic plan view of a photocoupler using the mounting member according to the second embodiment.
Figure 4B:
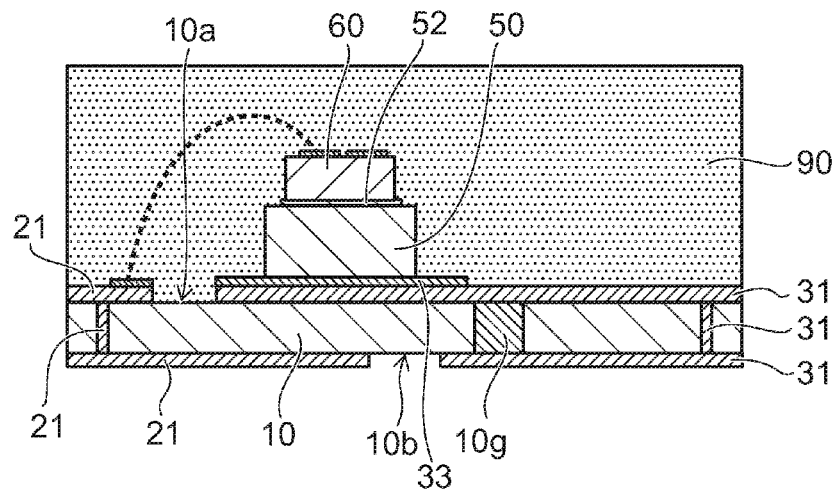
FIG. 4B is a schematic cross-sectional view taken along line A-A.

FIG. 4A is a schematic plan view of a photocoupler using the mounting member according to the second embodiment, and FIG. 4B is a schematic cross-sectional view taken along line A-A.

The photocoupler includes the mounting member 5 of FIG. 3, the light receiving element 50 bonded to the second terminal 31 and having a light receiving surface on its upper surface, the light emitting element 60 that emits light to the light receiving surface, the bonding layer 52 having light transmissivity and insulating properties and bonding the light emitting element 60 to the upper surface of the light receiving element 50, and the sealing resin layer 90.

The anode electrode and the cathode electrode of the light emitting element 60 are connected to the first conductive regions AA of the first terminals 21 and 22, respectively, by bonding wires or the like. One electrode provided on the first surface 10a of the light receiving element 50 is connected to the first conductive regions AA of the second terminal 32 by a bonding wire or the like. The other electrode of the light receiving element 50 is provided on its lower surface and bonded to the second terminal 31.

The sealing resin layer 90 covers the light receiving element 50, the light emitting element 60, the first surface 10a of the insulating substrate 10, and each first conductive region AA and the second conductive region BB on each first and second terminal 20, 30, and protects the interior. Therefore, the sealing resin layer 90 adheres firmly to the mounting member 5, and can maintain high moisture resistance and reliability.

Figure 5A:
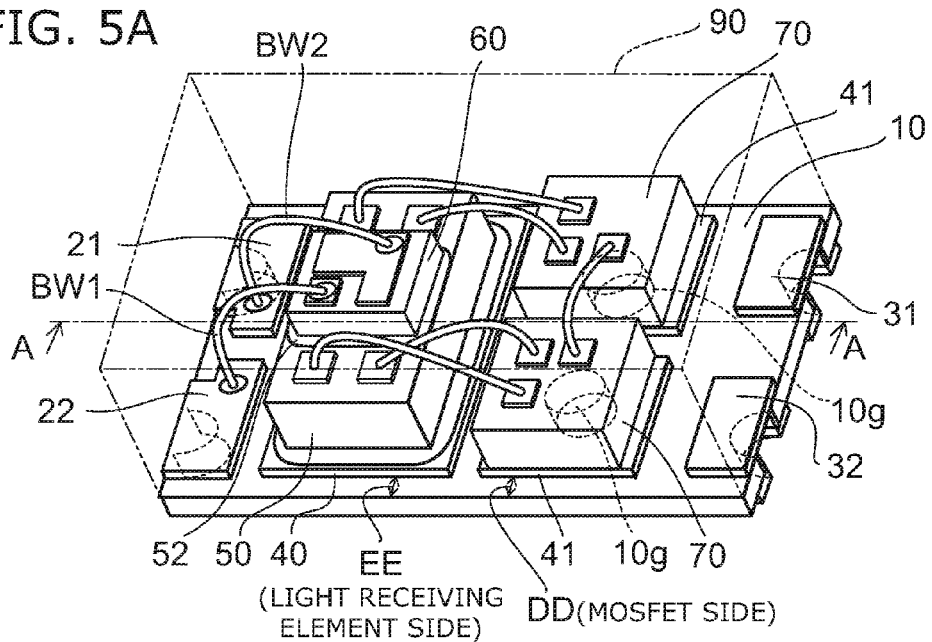
FIG. 5A is a schematic perspective view of a photocoupler using a mounting member according to a third embodiment.
Figure 5B:
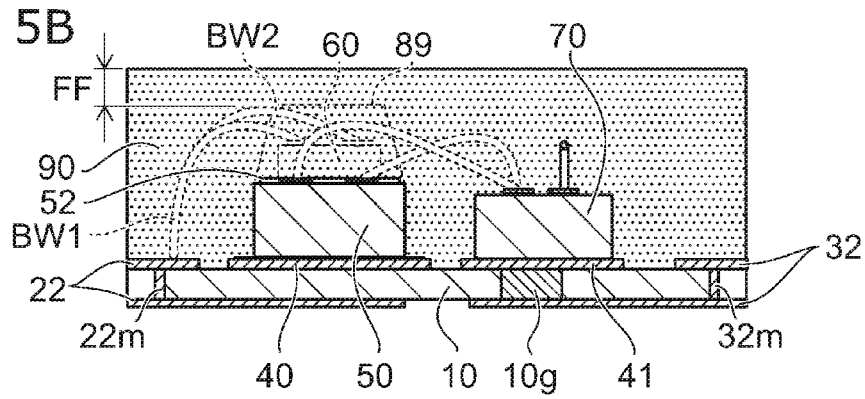
FIG. 5B is a schematic cross-sectional view taken along line A-A.
Figure 5C:
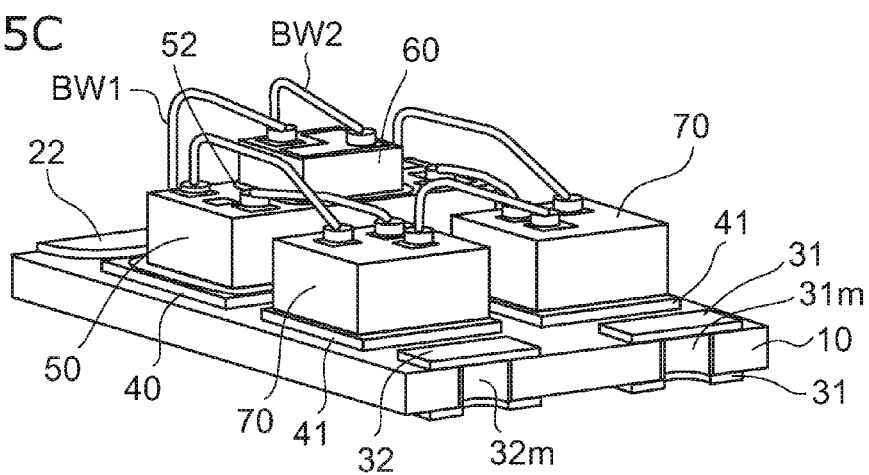
FIG. 5C is a schematic perspective view before sealing.

FIG. 5A is a schematic perspective view of a photocoupler using a mounting member according to a third embodiment, FIG. 5B is a schematic cross-sectional view taken along line A-A, and FIG. 5C is a schematic perspective view before sealing.

The mounting member 5 further includes a second die pad unit 41 provided on a region of the first surface 10a between the second terminal 30 and the first die pad unit 40.

In the mounting member 5 according to the third embodiment, as viewed from above, the first die pad unit 40, the second die pad unit 41, the first terminal 20, and the second terminal 30 are apart from one another on the first surface 10a of the insulating substrate 10.

The photocoupler includes the mounting member 5, a MOSFET 70 bonded to the second die pad unit 41, the light receiving element 50 bonded to the first die pad unit 40 and having a light receiving surface on its upper surface, the light emitting element 60 that emits light to the light receiving surface, the bonding layer 52 having light transmissivity and insulating properties and bonding the light emitting element 60 to the upper surface of the light receiving element 50, and the sealing resin layer 90. The light receiving element 50 having a light receiving surface on its upper surface and the light emitting element 60 that emits light to the light receiving surface may be covered with a transparent silicone resin 89 (shown by the broken line) or the like.

The number of MOSFETs 70 may be one, but in the drawing, two elements connected in a source common manner are included. When it is assumed that the chip back surface of each MOSFET 70 is a drain, the second terminals 31 and 32 form the drains of the MOSFETs.

The sealing resin layer 90 covers the light receiving element 50, the light emitting element 60, the first surface 10a of the insulating substrate 10, the conductive regions 21, 22, 31, and 32, and the MOSFETs 70, and protects the interior. In the case where the light receiving element 50 and the light emitting element 60 are covered with the transparent silicone resin 89 or the like, when the mounting member 5 is configured such that the distance DD between the outer edge of the mount bed of the MOSFET 70 and the outer edge of the sealing resin layer 90 is 40 μm or the like, and the distance EE between the outer edge of the mount bed of the light receiving element 50 and the outer edge of the sealing resin layer 90 is 70 μm or the like, the sealing resin layer 90 adheres firmly to the first surface 10a of the insulating substrate 10, and can maintain high moisture resistance and reliability.

Table 1 shows the failure rate of a gross leak test with respect to the distance between the outer edge of the sealing resin layer and the outer edge of the mount bed.

TABLE 1

|  |  | Thickness of dicing blade (mm) | | |
|---|---|---|---|---|
|  |  | 0.3 | 0.25 | 0.2 |
| Resin-mountbed distance (μm) | Max | 23 | 47 | 66 |
|  | Ave | 20 | 46 | 62 |
|  | Min | 17 | 43 | 57 |
| Failure rate in gross-leak test (%) | EE side | 90 | 22 | 0 |
|  | DD side | 20 | 0 | 0 |

As shown in Table 1, the distance EE between the outer edge of the mount bed of the light receiving element 50 and the outer edge of the sealing resin layer 90 needs to be set longer than the distance DD between the outer edge of the mount bed of the MOSFET 70 and the outer edge of the sealing resin layer 90. Furthermore, when the distance DD is a minimum value, the distance EE is preferably longer than the distance DD by at least 15 μm. Alternatively, when the distance EE is a minimum value, the distance DD is preferably longer than (distance EE−15 μm). As a result, the MOSFET 70, the light emitting element 60, the light receiving element 50, and the bonding wires connecting these can maintain high long-term reliability even in an environment of high temperature and high humidity.

The photocoupler includes the mounting member 5, the MOSFET 70 bonded to the second die pad unit 41, the light receiving element 50 bonded to the first die pad unit 40 and having a light receiving surface on its upper surface, the light emitting element 60 that emits light to the light receiving surface, and the first and second terminals 20 and 30, and is designed with a minimum configuration area. As an example, the area of the mounting member 5 may be approximately 3.6 $mm^2$. The MOSFET 70 at this time can be made 0.28 $mm^2$ and the light receiving element 50 can be made 0.58 $mm^2$ or the like; and the area ratio of each element to the mounting member 5 can be made approximately 32% and the area ratio of the first die pad unit 40 and the second die pad unit 41 to the mounting member 5 can be made 61%. Thus, the size can be significantly reduced as compared to conventional ones. In addition, the adhesion between the first surface 10a and the sealing resin layer 90 can be ensured by 39%, and high long-term reliability can be maintained even in an environment of high temperature and high humidity. In the case of being lower than this adhesion area, long-term reliability was not able to be maintained due to the peeling from the outer edge of the sealing resin layer 90 etc.

In the schematic cross-sectional view taken along line A-A shown in FIG. 5B, the vertical height composed of the mounting member 5, the MOSFET 70 bonded to the second die pad unit 41, the light receiving element 50 bonded to the first die pad unit 40 and having a light receiving surface on its upper surface, the light emitting element 60 that emits light to the light receiving surface, and bonding wires BW1 and BW2 bonding the electrodes of the light emitting element 50 and the first terminal 20 can be made approximately 0.94 mm; and even if its tolerance is assumed to be 0.11 mm at a maximum, the height is 1.05 mm. Thus, the upper surfaces of the bonding wires BW1 and BW2 do not protrude from the sealing resin layer 90, and the design can be made such that the total thickness of the mounting member 5 and the sealing resin layer 90 is 1.3 mm, which is a minimum value that can maintain long-term reliability. Furthermore, the distance FF between the bonding wires BW1 and BW2 including the transparent silicone resin 89 and the outer edge of the sealing resin layer 90 was able to be made 0.11 mm, and reliability was similarly able to be obtained when the distance FF was within a range up to 1.16 mm. The distance FF can be made 70 μm by normal metallic mold at least similarly to the distance EE between the outer edge of the sealing resin layer 90 and the light receiving element 50 as viewed from the upper surface. A high accuracy metallic mold may be used to obtain approximately 30 μm. As shown in FIG. 5C, an inner wall conductive region (31m, 32m, or the like) formed by plating or the like may be provided on the inner wall surface of the notch provided on the side surface of the insulating substrate 10, and may be connected to each of the conductive regions 21, 22, 31, and 32.

FIGS. 6A to 6H are schematic views showing the manufacturing process of an opposed-type photocoupler according to a comparative example. That is, FIG. 6A is a schematic partial side view of a light emitting-side lead frame, FIG. 6B is a schematic partial plan view thereof, FIG. 6C is a schematic partial side view of a light receiving-side lead frame, FIG. 6D is a schematic partial plan view thereof, FIG. 6E is a schematic side view in which the two lead frames are opposed, FIG. 6F is a schematic cross-sectional view of a structure in which a chip is covered with a transparent resin, FIG. 6G is a schematic cross-sectional view of a structure in which the transparent resin and the lead frames are molded with a light shielding resin, and FIG. 6H is a schematic cross-sectional view after lead cutting.

As shown in FIGS. 6A and 6B, a light emitting element 111 is bonded to a light emitting-side lead frame 100. FIG. 6A is a schematic partial cross-sectional view taken along line C-C. As shown in FIGS. 6C and 6D, a light receiving element 121 and two MOSFETs 131 and 132 are bonded to a light receiving-side lead frame 200. FIG. 6C is a schematic partial cross-sectional view taken along line D-D.

The light emitting-side lead frame 110 and the light receiving-side lead frame 200 are opposed to each other as shown in FIG. 6E. The light emitting element 110, the light receiving element 120, and the two MOSFETs 131 and 132 are covered with a transparent resin 160. The shape of the transparent resin 160 is determined by the surface tension etc., and forms a light propagation path.

As shown in FIG. 6G, the transparent resin 160, the light emitting-side lead frame 100, and the light receiving-side lead frame 200 are sealed with a light shielding resin 170. As shown in FIG. 6H, the light emitting-side lead frame 100 and the light receiving-side lead frame 200 are cut and processed by forming; thus, a photocoupler is formed.

In the comparative example, it is necessary that the thickness between the lead frame and the end surface of the light shielding resin 170 and the thickness between the transparent resin 160 and the end surface of the light shielding resin 170 be set to, for example, 0.5 mm or more to suppress the occurrence of a crack of the light shielding resin 170 by thermal stress. Therefore, the downsizing and thinning of the photocoupler are difficult. Furthermore, in the structure of the comparative example, the number of devices obtained is smaller than that of the substrate structure using the mounting member of the first embodiment, and it is difficult to increase mass productivity.

Figure 7A:
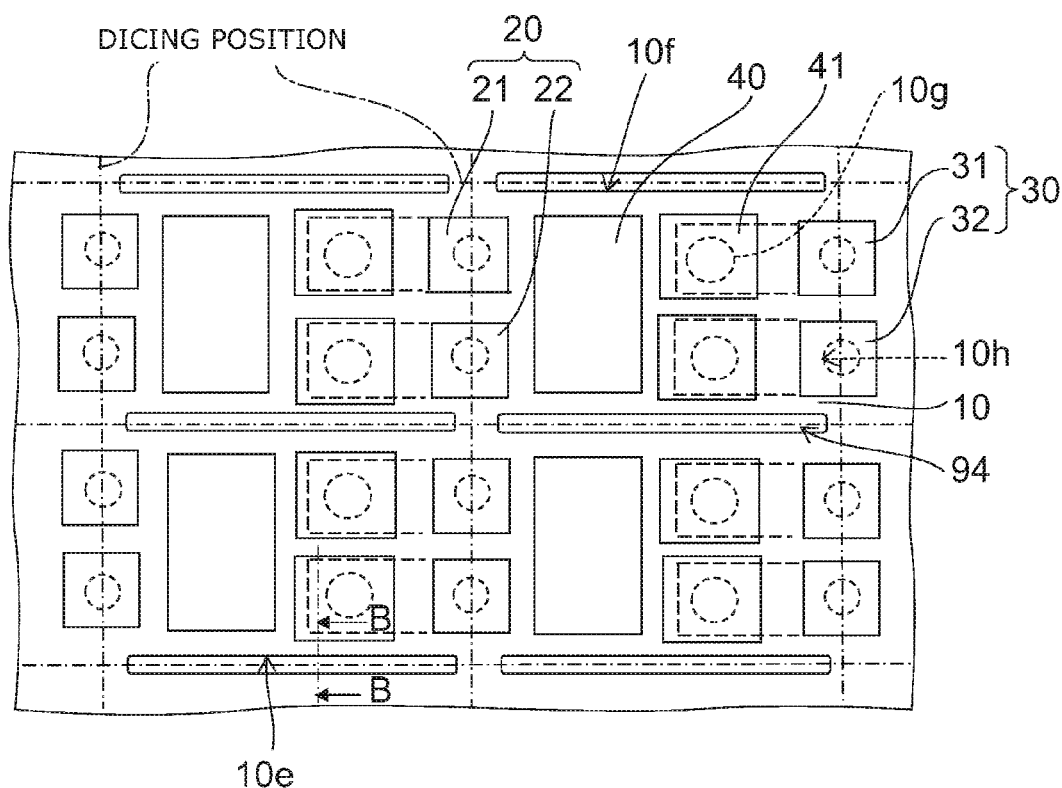
FIG. 7A is a schematic plan view before cutting of a modification example of the mounting member of the third embodiment.
Figure 7B:
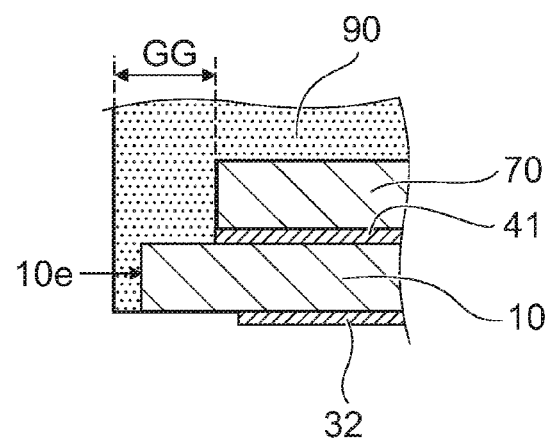
FIG. 7B is a schematic cross-sectional view taken along line B-B.

FIG. 7A is a schematic plan view before cutting of a modification example of the mounting member of the third embodiment, and FIG. 7B is a schematic cross-sectional view taken along line B-B.

In the modification example of the insulating substrate 10, the through hole 10g for connecting the second die pad unit 41 and the second terminal 30, through holes for the notches 10h of the first and second terminals 20 and 30, and a separation trench portion 94 are provided. After the bonding of a light emitting element and a light receiving element and wire bonding are performed, the sealing resin layer 90 is provided. In this case, the sealing resin layer 90 is put in the separation trench portion 94, and is then cured.

In FIG. 7B, it is assumed that the MOSFET 70 is bonded to the second die pad unit 41. The third side surface 10e and the fourth side surface 10f are, after the separation process, covered with the sealing resin layer 90 put in the separation trench portion 94. Therefore, the adhesion to the insulating substrate 10 can be further enhanced; thus, the distance GG between the outer edge of the MOSFET 70 and the outer edge of the sealing resin layer 90 can be made shorter than that in the case where the separation trench portion 94 is not provided. The separation trench portion 94 may be a long and narrow through hole, a long and narrow recess, or the like.

Figure 8:
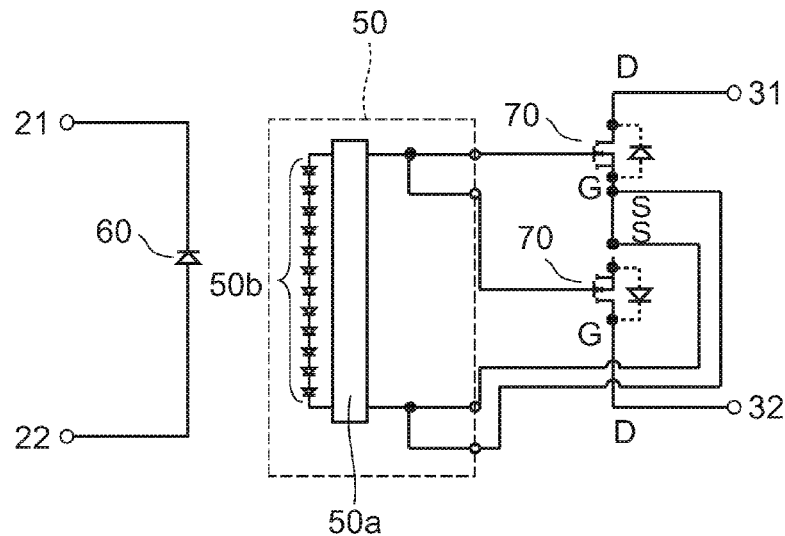
FIG. 8 is a configuration diagram of the photocoupler shown in FIG. 5.

FIG. 8 is a configuration diagram of the photocoupler shown in FIG. 5.

The light receiving element 50 may further include a control circuit 50a. The control circuit 50a is connected to a first electrode and a second electrode of a photodiode array 50b. By such a configuration, a voltage can be supplied to the gate of each of the MOSFETs 70 connected in a common-source connection.

The MOSFET 70 may be an n-channel enhancement type, for example. The MOSFET 70 is connected to the second electrode of the photodiode array 50b. Each gate is connected to the first electrode, and each drain D serves as an output terminal.

When the optical signal is ON, both the MOSFETs 70 become ON, and are connected to an external circuit including a power source and a load via the second terminal (output terminal) 30. On the other hand, when the optical signal is OFF, both the MOSFETs 70 become OFF, and are cut off from the external circuit. In the case of the common-source connection, linear output is enabled, and the switching of analog signals and AC signals becomes easy.

Figure 9:
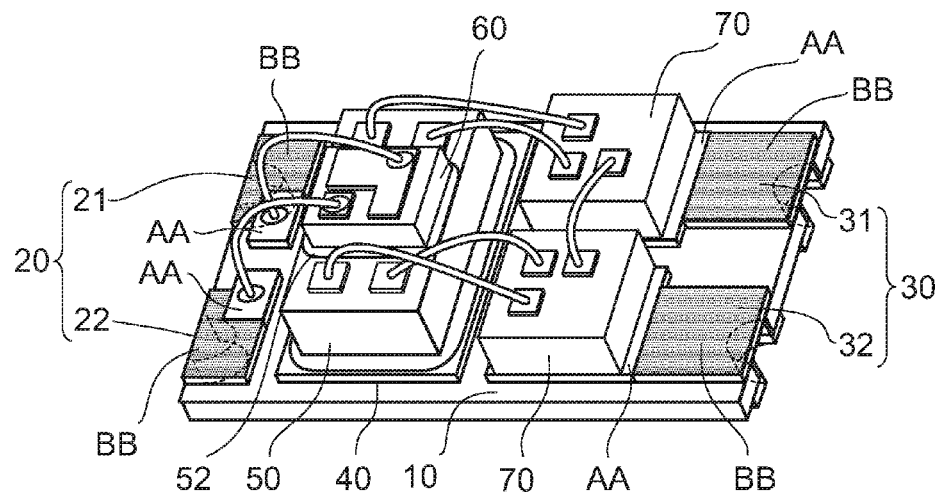
FIG. 9 is a schematic perspective view of a photocoupler using a mounting member according to a modification example of the second embodiment.

FIG. 9 is a schematic perspective view of a photocoupler using a mounting member according to a modification example of the second embodiment.

The mounting member 5 further includes the second die pad unit 41 provided on a region of the first surface 10a between the first terminal 20 and the second terminal 30.

As viewed from above, the second die pad unit 41, the first terminal 20, and the second terminal 30 are apart from one another on the first surface 10a of the insulating substrate 10. The MOSFETs 70 are connected to the first conductive regions AA selectively provided in the two conductive regions 31 and 32 of the second terminal 30.

The photocoupler includes the mounting member 5, the MOSFETs 70 bonded to the second terminals 31 and 32, the light receiving element 50 bonded to the die pad unit 40 and having a light receiving surface on its upper surface, the light emitting element 60 that emits light to the light receiving surface, the bonding layer 52 having light transmissivity and insulating properties and bonding the light emitting element 60 to the upper surface of the light receiving element 50, and the sealing resin layer 90.

The number of MOSFETs 70 may be one, but two elements in a common-source connection are included in FIGS. 8 and 9. When it is assumed that the chip back surface of each MOSFET 70 is a drain, the second terminals 31 and 32 form the drains of the MOSFETs.

The sealing resin layer 90 covers the light receiving element 50, the light emitting element 60, the first surface 10a of the insulating substrate 10, and the second conductive region BB of the second terminal 30, and protects the interior. The MOSFET 70, the light emitting element 60, and the light receiving element 50 can maintain high long-term reliability even in an environment of high temperature and high humidity.

The photocouplers shown in FIG. 5 and FIG. 9 are easy to downsize and thin, and are rich in mass productivity. In addition, the adhesion between the sealing resin layer 90 and the mounting member 5 is enhanced, and the moisture resistance can be improved. Thus, reliability can be maintained high even in an environment of high temperature and high humidity.

These photocouplers can be widely used in industrial equipment, office equipment, household electrical equipment, etc. Thus, the operation can be kept normal and stable in a device including different power sources.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a mounting member including an insulating substrate having a first surface and a second surface opposite to the first surface;
a first terminal provided on the first surface, and including a first conductive region; a second terminal provided on the first surface, and including a second conductive region;
a die pad unit provided between the first conductive region and the second conductive region, and including a third conductive region, the die pad unit being apart from the first terminal and the second terminal, respectively;
a light receiving element provided on the third conductive region; a light emitting element provided on the light receiving element; and
a sealing resin layer covering the light receiving element, the light emitting element, the first surface of the insulating substrate, the first conductive region, and the second conductive region, wherein
the mounting member further includes a conductive material layer provided in a through hole of the insulating substrate, and
the second conductive region and the third conductive region are electrically connected via the conductive material layer.

2. The device according to claim 1, further comprising:
a MOSFET, wherein
the third conductive region includes a first portion adjacent to the first terminal and a second portion adjacent to the second terminal,
the second portion of the third conductive region is electrically connected to the second conductive region via the conductive material layer,
the first and second portions are apart from each other,
the light receiving element is provided on the first portion, and
the MOSFET is provided on the second portion.

3. The device according to claim 1, wherein the light receiving element is isolated from the light emitting element.

4. The device according to claim 1, wherein the light emitting element is electrically connected to the first terminal.

5. The device according to claim 1, wherein the light emitting element emits light to a light receiving surface on an upper surface of the light receiving element.

6. The device according to claim 1, wherein
the insulating substrate further has a first side surface, and a second side surface opposite to the first side surface,
the first terminal is further provided on the first side surface, and
the second terminal is further provided on the second side surface.

7. The device according to claim 1, wherein the third conductive region includes Au or Ag.

8. A semiconductor device comprising:
a mounting member including an insulating substrate having a first surface and a second surface opposite to the first surface;
a first terminal provided on the first surface, and including a first conductive region;
a second terminal provided on the first surface, and including a second conductive region;
a die pad unit provided between the first conductive region and the second conductive region, and including a third conductive region, the die pad unit being apart from the first terminal and the second terminal, respectively;
a light receiving element provided on the third conductive region;
a light emitting element provided on the light receiving element;
a sealing resin layer covering the light receiving element, the light emitting element, the first surface of the insulating substrate, the first conductive region, and the second conductive region; and
a MOSFET, wherein
the third conductive region includes a first portion adjacent to the first terminal and a second portion adjacent to the second terminal,
the first and second portions are apart from each other,
the light receiving element is provided on the first portion, and
the MOSFET is provided on the second portion.

9. The device according to claim 8, wherein the light receiving element is isolated from the light emitting element.

10. The device according to claim 8, wherein the light emitting element is electrically connected to the first terminal.

11. The device according to claim 8, wherein the light emitting element emits light to a light receiving surface on an upper surface of the light receiving element.

12. The device according to claim 8, wherein
the insulating substrate further has a first side surface, and a second side surface opposite to the first side surface,
the first terminal is further provided on the first side surface, and
the second terminal is further provided on the second side surface.

13. The device according to claim 8, wherein
the insulating substrate further has a third side surface and a fourth side surface opposite to the third side surface, and
the sealing resin layer further covers the third and fourth side surfaces.

14. The device according to claim 8, wherein the third conductive region includes Au or Ag.

15. A semiconductor device comprising:
a mounting member including an insulating substrate having a first surface and a second surface opposite to the first surface;
a first terminal provided on the first surface, and including a first conductive region;
a second terminal provided on the first surface, and including a second conductive region;
a die pad unit provided between the first conductive region and the second conductive region, and including a third conductive region, the die pad unit being apart from the first terminal and the second terminal, respectively;
a light receiving element provided on the third conductive region;
a light emitting element provided on the light receiving element; and
a sealing resin layer covering the light receiving element, the light emitting element, the first surface of the insulating substrate, the first conductive region, and the second conductive region, wherein
the insulating substrate further has a first side surface, and a second side surface opposite to the first side surface,
the first terminal is further provided on the first side surface,
the second terminal is further provided on the second side surface, and
notches are provided on the first and second side surfaces.

16. The device according to claim 15, wherein
the first terminal is further provided on the notches of the first side surface, and
the second terminal is further provided on the notches of the second side surface.

17. The device according to claim 16, wherein a distance between an outer edge of the first portion and an outer edge of the sealing resin layer is longer than a distance between an outer edge of the second portion and the outer edge of the sealing resin layer.

18. The device according to claim 17, wherein the distance between the outer edge of the first portion and the outer edge of the sealing resin layer is longer than the distance between the outer edge of the second portion and the sealing resin layer by at least 15 µm.

* * * * *